(12) United States Patent
McBride

(10) Patent No.: US 6,275,970 B1
(45) Date of Patent: Aug. 14, 2001

(54) EVALUATION OF THE DESIGN QUALITY OF NETWORK NODES

(75) Inventor: John G McBride, Ft Collins, CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/252,378

(22) Filed: Feb. 18, 1999

(51) Int. Cl.[7] .............................. G06F 17/50; G06F 7/38; H01L 25/00
(52) U.S. Cl. ................... 716/4; 716/1; 716/5; 326/44; 326/49; 326/41; 703/15
(58) Field of Search .................. 438/10; 716/1, 716/4, 5; 326/37–41, 44, 49

(56) References Cited

U.S. PATENT DOCUMENTS 5,987,240 * 11/1999 Kay ........................................... 716/5
6,077,717 * 6/2000 McBride ................................ 438/10

OTHER PUBLICATIONS

Pitty, E., et al.; "A simulation–based protocol–driven scan test design rule checker"; IEEE International Test Conference; 1994; pp. 999–1006.*

Chen, W; The VLSI Handbook; IEEE Press; 2000; pp. 33–2.*

* cited by examiner

Primary Examiner—Matthew Smith
Assistant Examiner—Jibreel Speight

(57) ABSTRACT

A method and apparatus for detecting a predischarge node in an integrated circuit. The apparatus comprises a computer capable of being configured to execute a rules checker program which analyzes information relating to the integrated circuit to determine whether a predischarge node exists in the integrated circuit. The rules checker program evaluates each node in the integrated circuit and determines whether or not an N field effect transistor (NFET) is connected to the node and, if so, whether the gate terminal of the NFET is connected to a clock and whether a drain or source terminal of the NFET is connected to ground. The rules checker program also determines whether or not a P field effect transistor (PFET) is connected to the node being evaluated and, if so, whether it has a gate terminal which is not connected to a clock and drain and source terminals which are not connected to a supply. If all of these conditions are true, the rules checker program determines that the node being evaluated is a predischarge node.

13 Claims, 7 Drawing Sheets

EVALUATION OF THE DESIGN QUALITY OF NETWORK NODES

TECHNICAL FIELD OF THE INVENTION

The present invention generally relates to computer-aided circuit design systems and, more particularly, to a method and apparatus for evaluating the design quality of network nodes in an integrated circuit to detect predischarge nodes.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as PathMill, for example, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to build a database which is then utilized by the rules checking system of the present invention to evaluate the design quality of network nodes, preferably of network nodes of FET-level circuits designed in accordance with VLSI techniques.

Preferably, the rules checking system of the present invention evaluates circuit nodes to determine whether any of the circuit nodes are predischarge nodes. In accordance with certain design criterion, predischarge nodes are not allowed. However, due to errors that may occur during the design process, either human or otherwise, predischarge nodes sometimes occur. Therefore, a need exists for a rules checking system that will allow predischarge nodes to be detected so that they can be eliminated from the design.

SUMMARY OF THE INVENTION

The present invention provides a method and apparatus for detecting a predischarge node in an integrated circuit. The apparatus comprises a computer capable of being configured to execute a rules checker program, which analyzes information relating to the integrated circuit to determine whether a predischarge node exists in the integrated circuit.

In accordance with the preferred embodiment of the present invention, the rules checker program evaluates each node in the integrated circuit and determines whether or not an N field effect transistor (NFET) is connected to the node and, if so, whether the gate terminal of the NFET is connected to a clock and whether a drain or source terminal of the NFET is connected to ground. The rules checker program also determines whether or not a P field effect transistor (PFET) is connected to the node being evaluated and, if so, whether it has a gate terminal which is not connected to a clock. If both of these conditions are true, the node is a predischarge node.

In accordance with the preferred embodiment, if the program determines that the NFET has a gate terminal connected to a clock and a drain or a source terminal connected to ground, the program causes a first flag to be set. If the program determines that the PFET has a gate terminal which is not connected to a clock, the program causes a second flag to be set. When the first and second flags have been set, the program determines that a predischarge node exists in the circuit.

If the program determines that the NFET does not have a gate terminal which is connected to a clock or does not have a drain or a source terminal which is connected to ground, the program determines whether the gate terminal is a compliment of the node being evaluated. If the program determines that the gate terminal is not the compliment of the node being evaluated, the program determines that the node being evaluated is not a predischarge node. If the program determines that the PFET is connected by its gate terminal to a clock, then the program determines whether or not the PFET is a feedback element. If the program determines that the PFET is not a feedback element, the program determines that the node being evaluated is not a predischarge node.

These and other advantages and features of the present invention will become apparent to those skilled in the art from the following description, drawings and claims.

DETAILED DESCRIPTION OF THE PRESENT INVENTION

Figure 1:
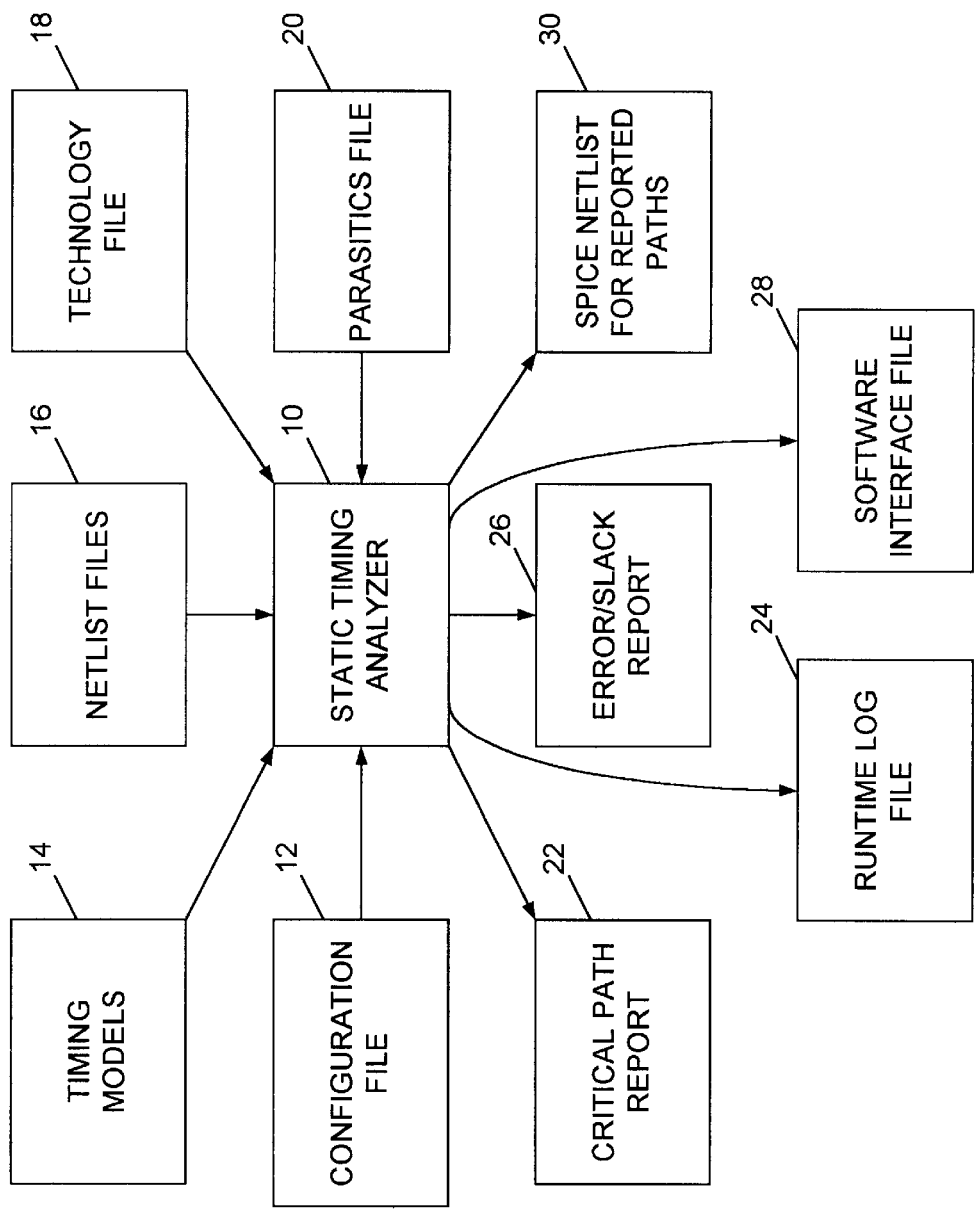
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMll. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their inter-relations.

Figure 2:
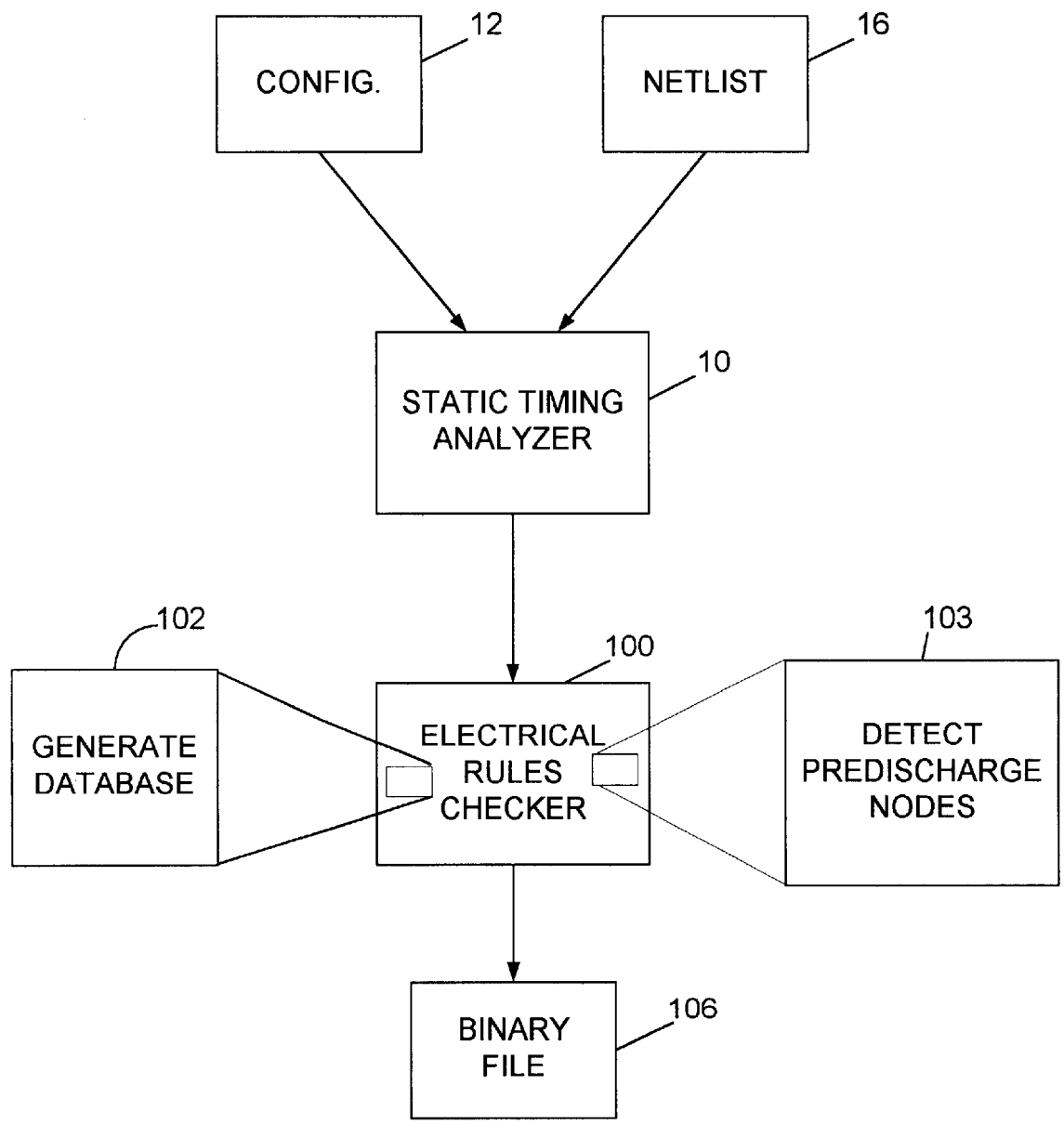
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 in accordance with the preferred embodiment of the present invention operates to identify predischarge nodes in an integrated circuit design. This is only one example of the multitude of checks that may be performed by he electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated must be generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for mechanical and chemical systems. It will be apparent to those skilled in the art how data structures similar to those generated for elements and nodes in the electrical context may be generated in mechanical and chemical contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the Pathmill static timing analyzer, in order to provide an example of one possible implementation of the present invention. However, those skilled in the art will understand that the electrical rules checker 100 of the present invention and the database of the present invention are not limited to use with any particular program.

The Pathmill static timing analyzer provides an application program interface (API) which allows the Pathmill static timing analyzer to communicate with the electrical rules checker 100 of the present invention. This API allows code external to the Pathmill program to be linked to the Pathmill program so that the external code and the Pathmill program itself comprise one executable which can be run as a single program. The electrical rules checker 100 of the present invention utilizes this API to obtain information from the Pathmill static timing analyzer which can be utilized by the electrical rules checker 100 to generate the database of the present invention, as indicated by block 102.

Prior to the database of the present invention being generated, the Pathmill program runs and identifies circuit characteristics of the circuit under consideration such as, for example, FET direction, node types, latches, dynamic gates, clocks, rise and fall times, etc. Before the Pathmill program terminates, it calls the electrical rules checker 100 of the present invention. The Pathmill program has a feature commonly referred to as "hooks", which allows the Pathmill program to call routines at various stages of execution. Once the Pathmill program has finished identifying the characteristics mentioned above, the Pathmill program calls the electrical rules checker 100 of the present invention. The electrical rules checker 100 of the present invention, through this series of subroutine calls, creates its own database of the circuit under consideration.

Figure 3A:
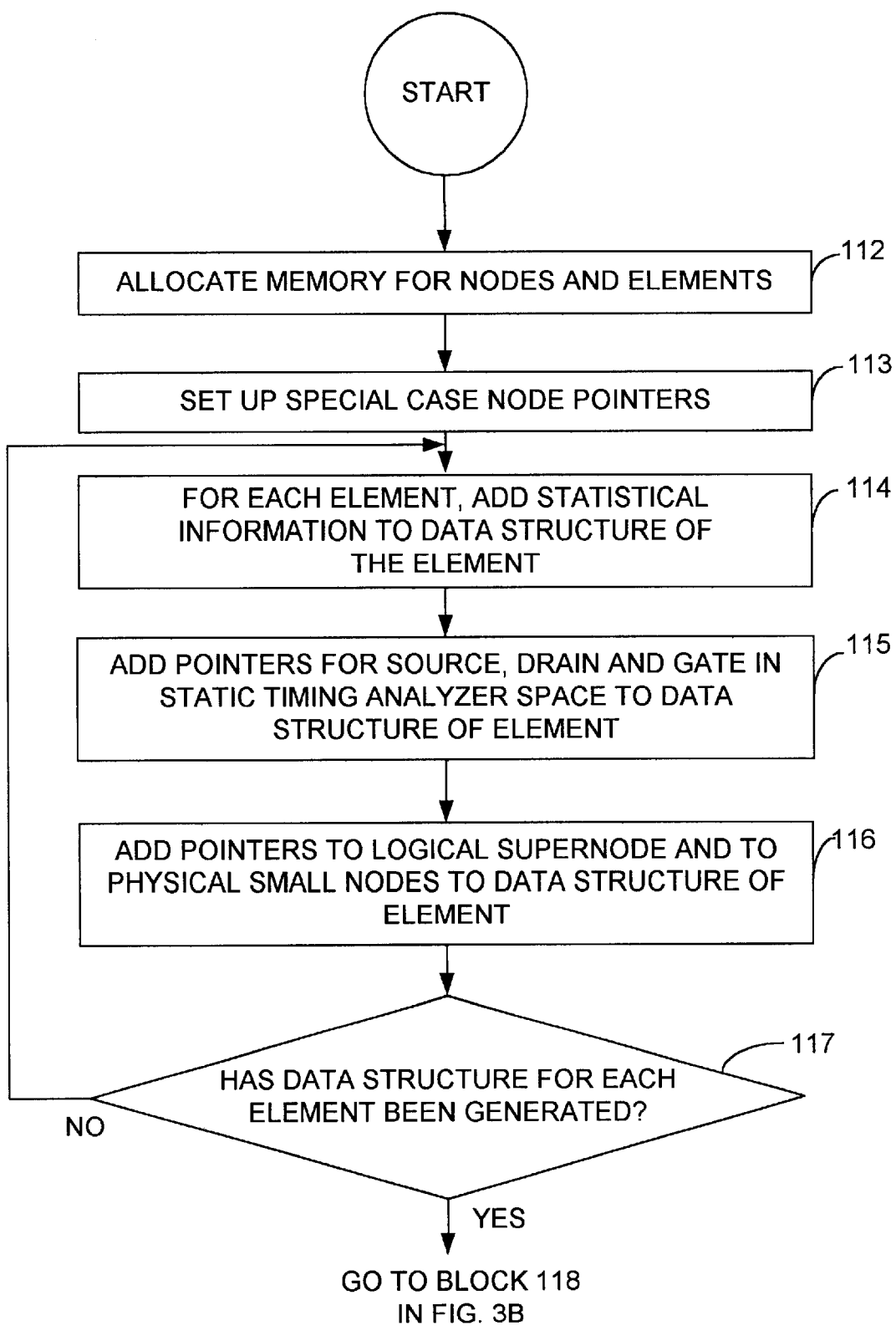
FIGS. 3A–3C together form a flow chart which illustrates the method of the present invention for generating the database of the present invention which can be utilized by a rules checking program to perform rules checking tasks.
Figure 3B:
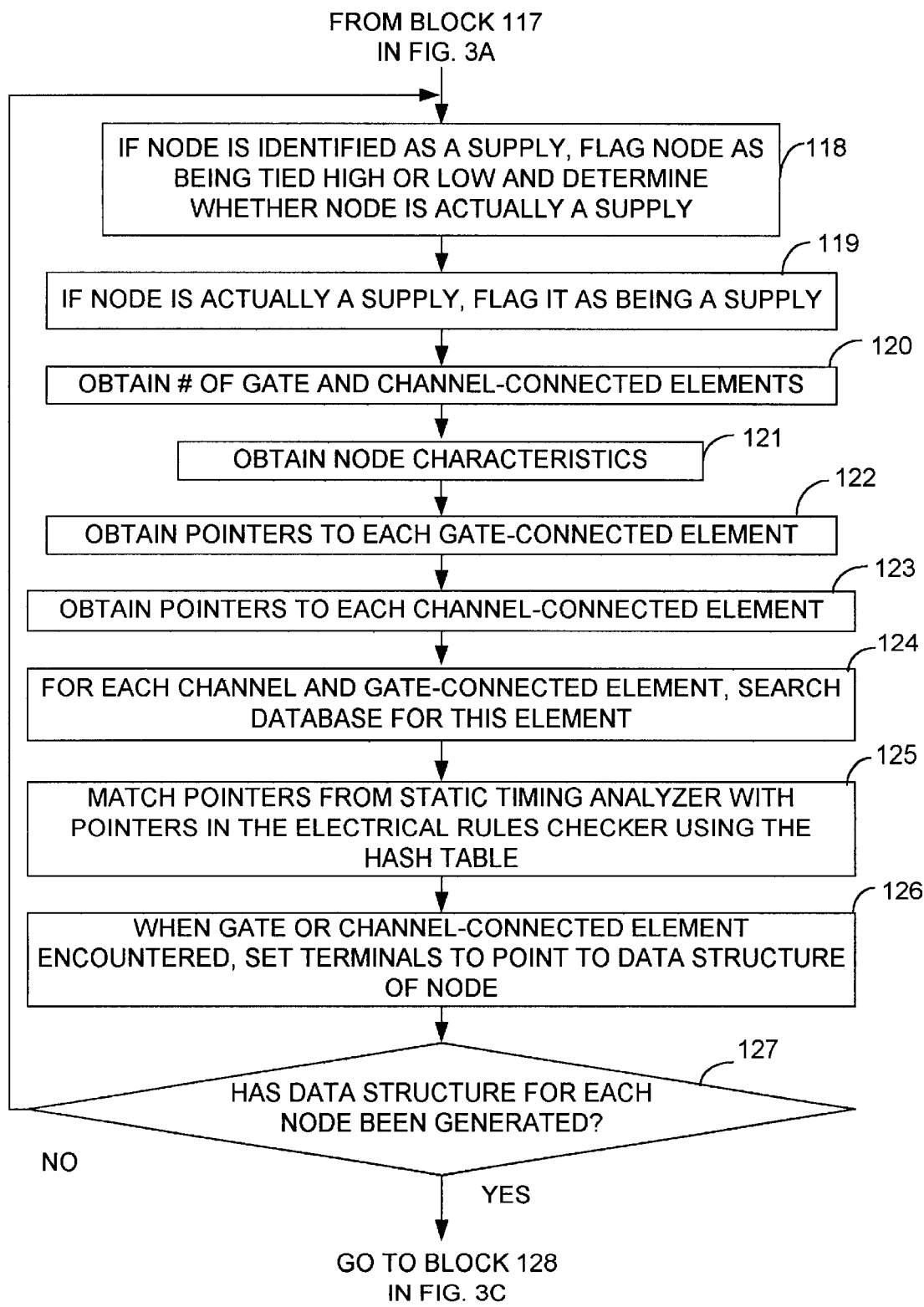

The first step in the process of generating the database is to allocate memory for the nodes and elements of the circuit, as indicated by block 112 in FIG. 3A. The Pathmill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 113. These special types of nodes will be used repeatedly during the process of generating the database, as discussed below in more detail. Therefore, the pointers for these nodes preferably are set up relatively early in the database generation process. For example, nodes which correspond to ground (GND) and to the supply voltage ($V_{DD}$) are special types of nodes and it is helpful to set up node pointers for these types of nodes. However, those skilled in the art will understand that this step, although it is preferable, is not necessary, but rather, is used to optimize efficiency in the database generation process of the present invention.

For each element, a data structure must be generated which can be utilized by the electrical rules checker 100 in performing the rules checking tasks. Steps 114–116 in FIG. 3A correspond to the steps for creating the element data structures. For each element, a data structure is defined and statistical information relating to the element is added to the data structure of the element, as indicated by block 114. This information includes, for example, the width of the element, the length of the element, the direction of the element, and the element type.

Once the statistical information has been included in the data structure of the element, the pointers for the source, drain and gate of each element, as defined in the space of the static timing analyzer, are included in the data structure of the element, as indicated by block 115. The pointers that were set up in step 113 are utilized in step 115. If either the source, drain or gate of the element is attached to ground or VDD, then the pointers for the source, drain and gate are set to the pointers for ground or VDD obtained in step 113.

A node in a circuit can be represented logically or physically. A logical representation of an element includes only FETs and does not include any resistors. This logical representation is identified in the Pathmill program as a "supernode". The logical representation does not account for parasitic resistance. On the other hand, a physical representation of a node, which is identified in the Pathmill program as a small node, includes FETs, but also includes resistors, which correspond to the parasitic resistance in the node. Therefore, in the physical representation, a small node exists between the resistors representing the parasitic resistance and between any FET and any one of the resistors. Each element has a pointer to a supernode and to a small node for each drain, source and gate. Therefore, there are six pointers for each FET.

Each small node in the physical representation maps to a single supemode in the logical representation. In block 116, the pointers corresponding to these nodes are added to the data structure of the element. A determination is then made at block 117 as to whether the data structures for all of the elements have been generated. If not, the steps in blocks 114–116 are performed for the next element.

Once the data structures for the elements have been generated, the data structures for the nodes must be generated. Blocks 118–126 in FIG. 3B correspond to the steps in the process of the present invention for generating the data structures of the nodes. In block 118, a determination is made as to whether a node has been identified by the Pathmill program as a supply. The Pathmill program identifies all nodes as supplies if the nodes are either tied high or low. If the node has been identified by the Pathmill program as corresponding to a supply, the node is flagged and the flag will indicate whether the node is tied high or whether it is tied low. A determination is then made as to whether the node is actually a supply, i.e., whether the node actually corresponds to ground or $V_{DD}$. If a determination is made that the node is actually a supply, the node is flagged as corresponding to a supply, as indicated by block 119.

The electrical rules checker 100 then obtains the number of gate-connected elements and the number of channel-connected elements from the static timing analyzer, as indicated by block 120. The electrical rules checker 100 also obtains the characteristics of the nodes from the static timing analyzer 10, as indicated by block 121. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 122. The electrical rules checker 100 then obtains the pointers from the static timing analyzer which point to each channel-connected element, as indicated by block 123. Then, for each channel connected element and for each gate-connected element, the electrical rules checker 100 searches its database to find an element in the space of the electrical rules checker 100 that corresponds to the element under consideration, as indicated by block 124.

The pointers for the elements provided by the static timing analyzer 10 are then matched with the pointers for the corresponding elements in the electrical rules checker 100 using a hash table which converts the pointers in the space of the static timing analyzer 10 into pointers in the space of the electrical rules checker 100, as indicated by block 125. Generally, each of the pointers in the space of the static timing analyzer is used as a hash key and when the hash key is plugged into the hash table, the pointer in the space of the electrical rules checker is output from the hash table. Hash tables and the manner in which they are utilized are well-known in the art. Therefore, a detailed discussion of the manner in which the pointers in the space of the static timing analyzer are converted using the hash table into pointers in the space of the electrical rules checker 100 will not be provided herein since persons skilled in the art will understand the manner in which this can be accomplished.

Once these steps have been performed, the electrical rules checker 100 has at its disposal a list of channel-connected elements and gate-connected elements as well as their pointers in the space of the electrical rules checker 100. In generating the node data structures, when the electrical rules checker 100 encounters a node that is connected to one of these channel-connected or gate-connected elements, the electrical rules checker 100 sets the terminals of the element to point to the data structure of the node under consideration, as indicated by block 126. The process then returns to the step in block 120 and generation of the data structure for the next node begins, as indicated by decisional block 127.

Figure 3C:
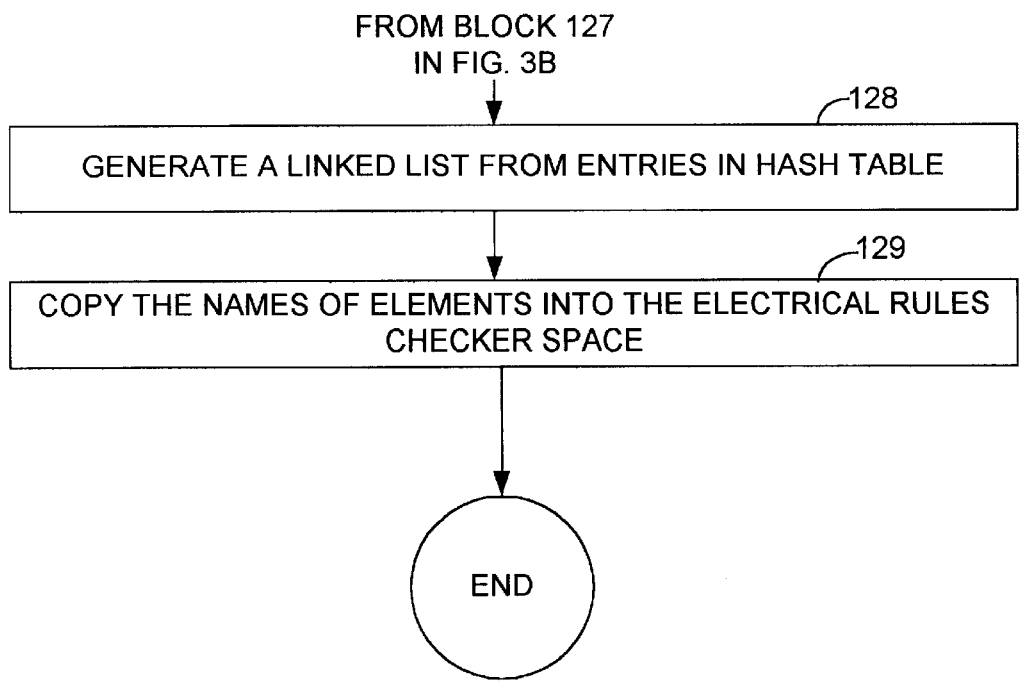

In order to enable the electrical rules checker 100 to maximize efficiency in searching the database of the present invention, once the data structures for all of the nodes have been created, a linked list is generated from the entries in the hash table, as indicated by block 128 in FIG. 3C. Every location in the hash table will not contain a valid entry. Therefore, in order to maximize efficiency in searching the database, a linked list is generated which links the valid entries in the hash table together such that each valid entry in the hash table points to the next valid entry in the hash table. Thus, when the electrical rules checker 100 of the present invention is searching for an element in the database of the present invention, the electrical rules checker 100 simply analyzes the elements contained in the linked list.

It should be noted that the arrangement of the elements in the linked list may or may not have any physical relationship to the arrangement of the elements in the circuit under consideration. Thus, the linked list is merely used to search through the elements stored in the database. Once the linked list has been generated, the names of the elements contained in the linked list are copied into electrical rules checker space, as indicated by block 129. This reduces the number of calls that need to be made to the Patmill program by the electrical rules checker 100. Once the database of the present invention has been generated, no more calls have to be made to the Pathmill program via the Pathmill API. The database of the present invention is comprised as the binary file 106 shown in FIG. 2.

Figure 4A:
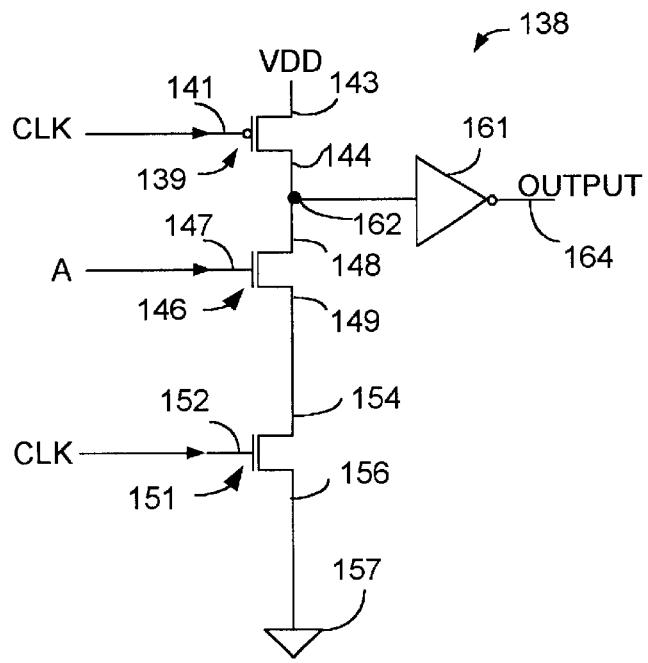
FIG. 4A is a schematic block diagram of an inverter gate which implements dynamic domino logic.

Once the database of the present invention has been generated in the manner described above, the electrical rules checker 100 of the present invention utilizes this database to perform the rules checking tasks. In accordance with the present invention, the electrical rules checker 100 evaluates a circuit to determine whether or not any predischarge nodes exist in the circuit. This task is represented by block 103 in FIG. 2. Prior to explaining how the electrical rules checker 100 detects predischarge nodes, a discussion will be provided of a circuit which implements dynamic domino logic correctly and which does not contain any predischarge nodes. The schematic block diagram shown in FIG. 4A represents such a circuit. After the circuit shown in FIG. 4A has been discussed, the circuit shown in FIG. 4B, which includes a predischarge node that must be detected, will be discussed.

FIG. 4A is a schematic block diagram of an inverter gate 138 which implements dynamic domino logic. Dynamic domino logic is advantageous because it precharges the output of the gate to the supply voltage, VDD, so that during the evaluation phase, the input to the gate is evaluated very quickly. Although the gate 138 shown in FIG. 4A is an inverter gate, those skilled in the art will understand that the present invention is not limited with respect to the type of circuit that is evaluated. An inverter gate is shown and discussed merely for exemplary purposes due to the fact that its implementation in dynamic domino logic is relatively simple.

The inverter gate 138 comprises a clocked PFET 139, a non-clocked NFET 146 and a clocked NFET 151. The clocked PFET 139 has a terminal 143, which is either the drain or source of the PFET 139, connected to VDD. The clocked PFET 139 has a second terminal 144, which is either the drain or source of the PFET, connected to the input of an inverter 161, which produces the output 164 of the gate 138. Therefore, the clocked PFET 139 is channel-connected to the supply, VDD. The gate 141 of the PFET 139 receives the clock signal, CLK. The terminal 144 of PFET 139 is connected to the inverter 161 at a precharge node 162.

The signal "A" is the input signal to the inverter gate 138 that is to be evaluated by the inverter gate 138. The input signal "A" is connected to the gate 147 of NFET 146. One of the terminals 148 of the NFET 146 is tied to the precharge node 162 and one of the terminals 149 of the NFET 146 is connected to one of the terminals 154 of the NFET 151. The NFET 151 is commonly referred to as the evaluation FET because it turns on during the evaluation phase which occurs when the clock signal CLK is high and causes the input signal A to be evaluated by the gate 138. One of the terminals 156 of the NFET 151 is tied to ground 157.

When the clock signal CLK goes low, the PFET 139 is turned on and the precharge node 162 is charged to VDD. This causes the output 164 of the inverter 161 to go low. When the clock signal goes high, which is during the evaluation phase, the evaluation NFET 151 is turned on. During the evaluation phase, if the input signal "A" at gate 147 of NFET 146 is high, the precharge node 162 will discharge to ground, thus causing the output 164 of the inverter 161 to be pulled up to VDD. NFETs typically are much faster than PFETS. Thus, during the evaluation phase, the output 164 of the inverter 161 pulls up very quickly due to the fact that the NFETs 146 and 151 turn on very quickly.

Figure 4B:
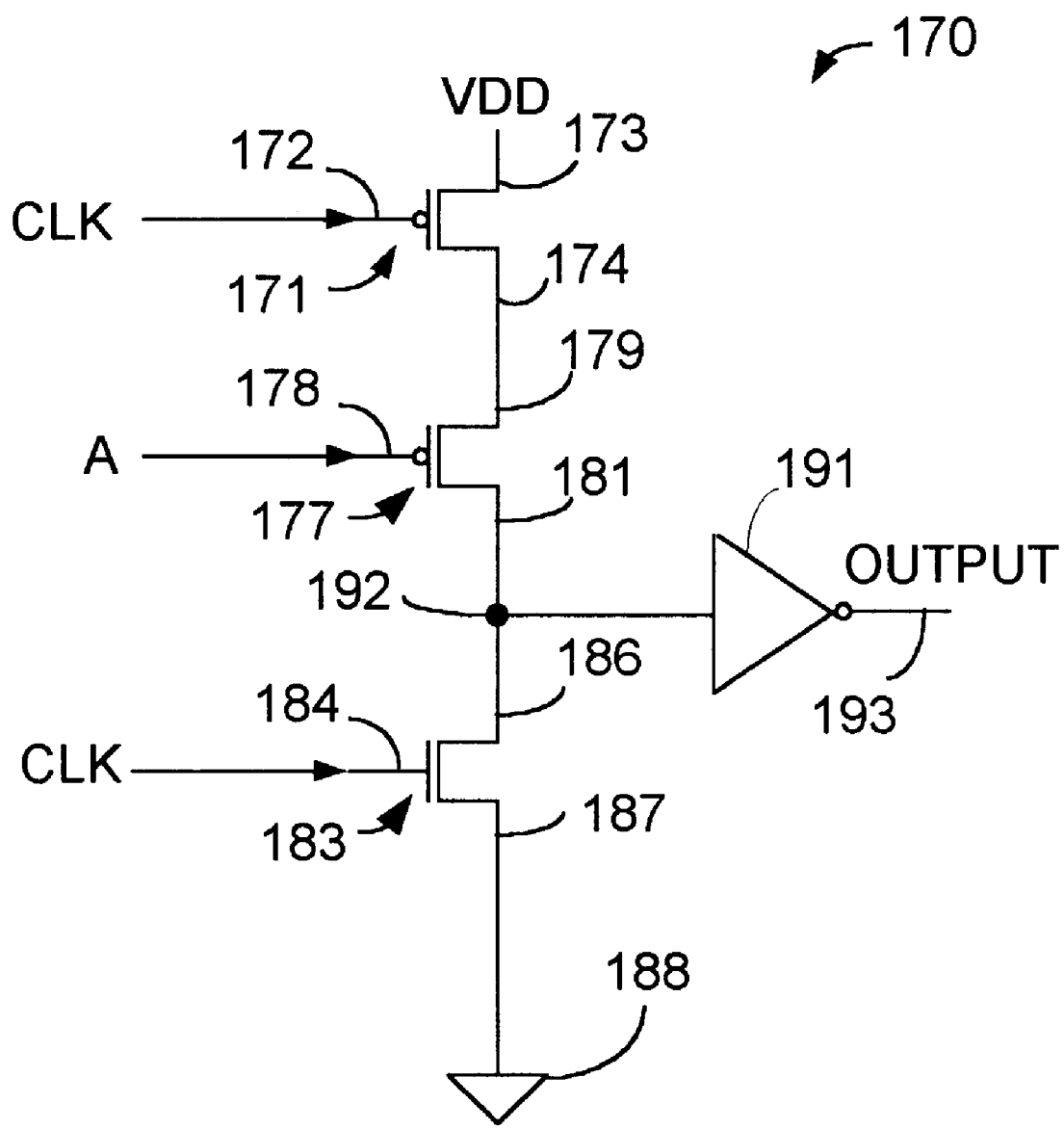
FIG. 4B illustrates a schematic block diagram of an inverter gate that contains a predischarge node.

FIG. 4B illustrates a schematic block diagram of an inverter gate 170 which essentially is a faulty design of a dynamic domino logic gate in that it implements "predischarge" logic rather than the "precharge" logic discussed above with respect to FIG. 4A. Therefore, the electrical rules checker 100 of the present invention is intended to detect a predischarge node so that the design error can be corrected.

The inverter gate 170 comprises a clocked PFET 171, a non-clocked PFET 177 and a clocked NFET 183. The clocked PFET 171 is channel-connected by its terminal 173 to the supply voltage VDD. The terminal 174 of the clocked PFET 171 is connected to one of the terminals 179 of the non-clocked PFET 177. The gate 178 of the non-clocked PFET 177 receives the input signal "A" to be evaluated. The terminal 181 of the non-clocked PFET 177 is connected to the terminal 186 of the clocked NFET 183, and these terminals are connected to the input of the inverter 191 at node 192. The other terminal 187 of the NFET 183 is connected to ground 188.

When the clock signal CLK is high, the node 192 will be pulled down to ground, thus causing the output 193 of the inverter 191 to be pulled up to VDD. During the evaluation phase, when the clock signal CLK is low, the clocked PFET 171 is turned on. The output 193 of the inverter 191 will depend on whether the input signal "A" is high or low since the node 192 cannot be charged to VDD unless the input signal "A" is low. This is undesirable because the node 192 is in a predischarged state rather than in a charged state at the beginning of the evaluation phase. The only way the output 193 of the inverter 191 will go low is when both of the PFETs 171 and 177 are on at the same time. Thus, the time that it takes the output 193 to go low will be limited by the speed with which the PFETs 171 and 177 can be turned on, which is undesirable due to the relatively low switching speed of PFETs compared to that of NFETs, as mentioned above with reference to FIG. 4A. Therefore, node 192 is a predischarge node that needs to be detected.

In order to detect this design flaw, the electrical rules checker 100 of the present invention evaluates a circuit such as that shown in FIG. 4B to determine whether the circuit contains a clocked NFET that is channel-connected to ground and a non-clocked PFET that is not channel-connected directly to VDD. The manner in which the electrical rules checker 100 of the present invention accomplishes this, in accordance with the preferred embodiment of the present invention, is illustrated by the flow chart of FIG. 5.

Figure 5:
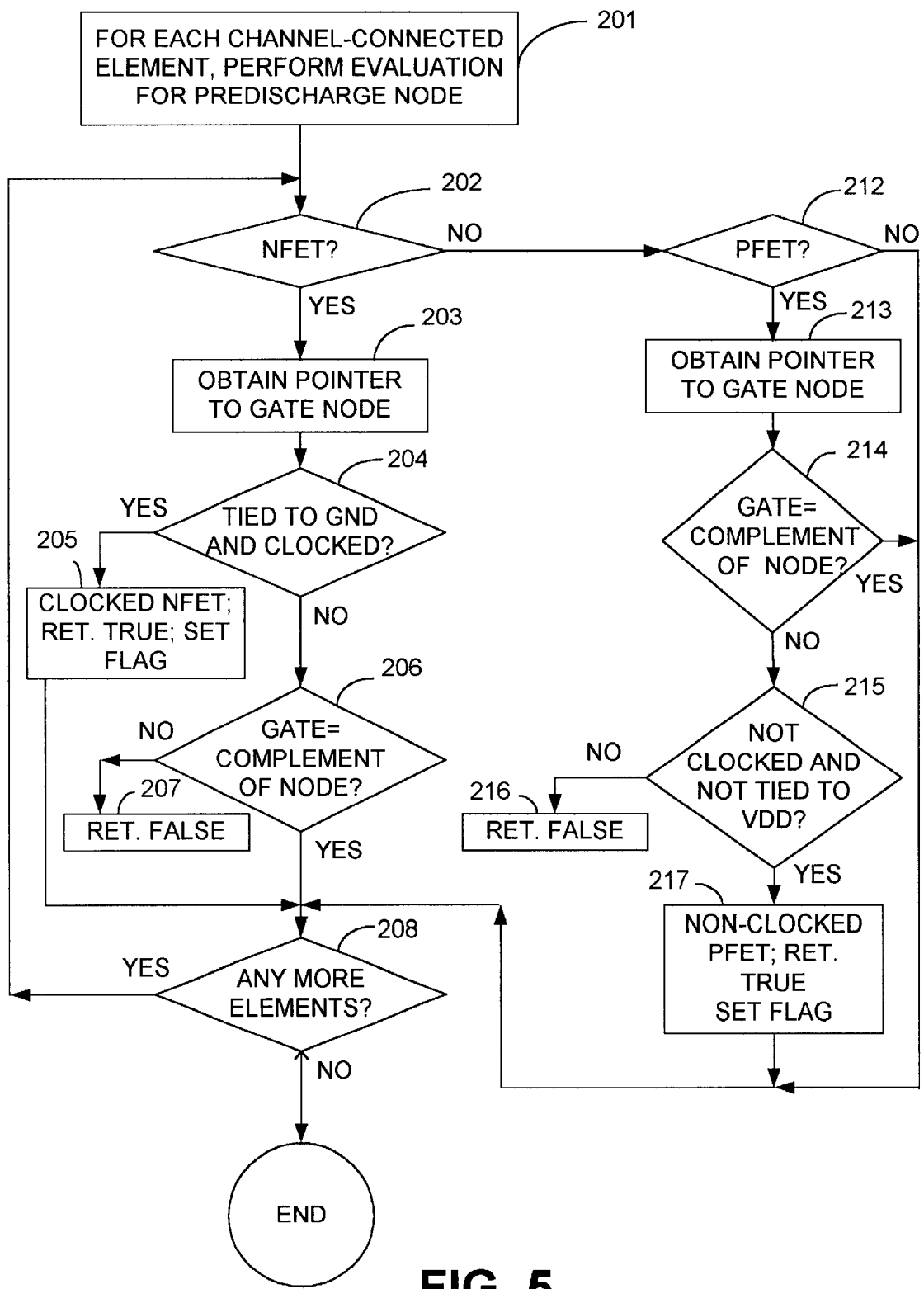
FIG. 5 illustrates a flowchart of the method of the present invention in accordance with the preferred embodiment for evaluating a circuit to determine whether or not it contains a predischarge node.

The electrical rules checker 100 utilizes the database discussed above to analyze the nodes of the circuit in order to determine whether the circuit contains a predischarge node. The data structures of the nodes and elements contain all of the information about the nodes and elements needed for the rules checker program 100 to determine whether the node under consideration is a predischarge node. For each element that is channel-connected to the node under consideration, the steps shown in FIG. 5 are performed to determine whether or not the circuit contains a predischarge node, as indicated by block 201. First, the electrical rules checker 100 determines whether the element under consideration is an NFET, as indicated by decisional block 202. If not, the process proceeds to block 212 where a determination is made as to whether or not the element under consideration is a PFET.

It will be understood by those saddled in the art that the order of the steps illustrated in blocks 202 and 212, and the steps which follow those steps in the respective branches of the process, can be modified if desired. Also, those skilled in the art will understand that it may be possible to use other algorithms to determine whether a circuit contains a predischarge node. Therefore, those skilled in the art will understand that the present invention is not limited to any particular algorithm for performing this task. The algorithm represented by the flow chart of FIG. 5 is only an exemplary embodiment of one suitable way to perform this task.

If a determination is made at block 202 that the element is an NFET, then the process proceeds to the step in block 203 where the pointer to the gate node of the element is obtained from the database. A determination is then made at block 204 as to whether the gate terminal is tied to a clock and whether the drain or source of the element is tied to ground. If both of those conditions are true, then the NFET is a clocked NFET and a flag is set, as indicated by block 205. The process the proceeds to block 208. If there are no more elements to be checked, the process is complete. If more elements need to be checked, the process returns to block 202.

If a determination is made at block 204 that either the NFET is not channel-connected to ground or that it is not clocked, then a determination is made at block 206 as to whether or not the gate is the complement of the node. If the gate is not the complement of the node, the NFET under consideration cannot be a feedback element and, therefore, must be there for some other reason. Therefore, the routine determines that the node being evaluated cannot be a predischarge node. In the overwhelming majority of cases, the forward looking gate in the circuit, e.g., gate 191 in FIG. 4B, is an inverter. Therefore, step 206 assumes that the forward looking gate is an inverter and determines that if the NFET is not a feedback element, the NFET is not part of an inverter and, consequently, is not channel-connected to a predischarge node.

Step 206 is not a critical step in the routine of the present invention, but is used to reduce or eliminate the number of false positive returns produced by the routine, i.e., the number of times the routine incorrectly identifies a node as being a predischarge node. Even without performing the function of block 206, the rules checker 100 will only rarely, if ever, incorrectly identify a node as a predischarge node. Step 206 preferably is performed because it adds additional security against incorrect classification of nodes.

If the gate node is the complement of the node being evaluated, then the process proceeds to block 208 where a determination is made as to whether any more elements need to be checked. If the gate node is not the complement of the node being evaluated, then the process returns a false indication, which indicates that the node being evaluated is not a predischarge node.

If a determination is made at block 202 that the element is not an NFET, the process proceeds to block 212 where a determinations is made as to whether the element is a PFET. If not, the process returns to block 208 where a determination is made as to whether any more elements need to be tested. If a determination is made at block 212 that the element under consideration is a PFET, then the rules checker 100 obtains the pointer to the gate node of the element. A determination is then made at block 214 as to whether the gate node is the complement of the node being evaluated. The step is identical to step 206 and is performed for identical reasons. Therefore, step 214 is also preferable but not a necessary step in the routine of the present invention.

If a determination is made that the gate node is the complement of the node being evaluated, then the process proceeds to block 208. If a determination is made that the gate node is not the complement of the node being evaluated, then the process proceeds to decisional block 215. A determination is made at block 215 as to whether or not the gate of the PFET is not tied to a clock and whether the PFET is tied to VDD. If both of these decisions are answered in the affirmative, then the element is a non-clocked PFET and a flag is set to indicate this, as indicated by block 217. The process the proceeds to block 208. If a determination is made at block 215 that the either the gate is tied to a clock or the PFET is tied to VDD, then the node under consideration is not a predischarge node and the process returns false, as indicated by block 216.

If flags are set during steps 205 and 217, then the rules checker 100 determines that the node under consideration is a predischarge node and the process is complete. It should be noted that the rules checker 100 may perform other tasks prior to or after performing the task of determining whether the circuit contains a predischarge node.

It should also be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for detecting a predischarge node in an integrated circuit, the apparatus comprising:

a computer capable of being configured to execute a rules checker program, the rules checker program analyzing information relating to the integrated circuit to determine whether a predischarge node exists in the integrated circuit, wherein when the rules checker program is executed by the computer, the rules checker program evaluates each node in the integrated circuit to determine whether or not each node in the circuit is a predischarge node by analyzing the information relating to the integrated circuit to determine whether or not the node being evaluated is connected to an N field effect transistor and to a P field effect transistor, by determining whether or not the N field effect transistor has a gate terminal which is connected to a clock and has either a drain or a source terminal connected to ground, and by determining whether or not the P field effect transistor has a gate terminal which is not connected to a clock and has drain and source terminals which are not connected to a supply.

2. The apparatus of claim 1, wherein if the program determines that the N field effect transistor has a gate terminal connected to a clock and a drain or a source terminal connected to ground, the program causes a first flag to be set.

3. The apparatus of claim 2, wherein if the program determines that the P field effect transistor has a gate terminal which is not connected to a clock and drain and source terminals which are not connected to a supply, the program causes a second flag to be set, and wherein when the first and second flags have been set, the program determines that a predischarge node exists in the circuit.

4. The apparatus of claim 3, wherein if the program determines that the N field effect transistor does not have a gate terminal which is connected to a clock or does not have a drain or a source terminal which is connected to ground, the program determines whether the gate terminal is a compliment of the node being evaluated, wherein if the program determines that the gate terminal is not the compliment of the node being evaluated, the program determines that the node being evaluated is not a predischarge node.

5. The apparatus of claim 4, wherein if the program determines that the P field effect transistor is connected by its gate terminal to a clock or is connected by a drain or source terminal to a supply, then the program determines that the node being evaluated is not a predischarge node.

6. A computer program embodied on a computer-readable medium, the computer program evaluating nodes of a circuit design to determine whether or not any of the nodes are predischarge nodes, the program comprising:

a first code segment for determining whether an N field effect transistor of the circuit design has a gate terminal connected to a clock and a drain or source terminal connected to ground; and a second code segment for determining whether a P field effect transistor of the circuit design has a gate terminal which is not connected to a clock and drain and source terminals which are not connected to a supply.

7. The computer program of claim 6, wherein if the first code segment determines that the gate terminal of the N field effect transistor is not connected to a clock or that the drain or source terminal of the N field effect transistor is not connected to ground, then the first code segment determines whether the gate terminal is a compliment of the node being evaluated, wherein if the first code segment determines that the gate terminal is not the compliment of the node being evaluated, the first code segment determines that the node being evaluated is not a predischarge node, and wherein if the first code segment determines that the gate terminal of the N field effect transistor is connected to a clock and that the drain or source terminal of the N field effect transistor is connected to ground, the first code segment causes a first flag to be set.

8. The computer program of claim 7, wherein the second code segment determines whether or not the gate terminal of the P field effect transistor is the complement of the node being evaluated, wherein if the second code segment determines that the gate terminal of the P field effect transistor is not the complement of the node being evaluated, the second code segment determines whether or not the gate terminal of the P field effect transistor is connected to a clock and whether or not either the drain or source terminal of the P field effect transistor is connected to a supply, wherein if the second code segment determines that the gate terminal of the P field effect transistor is connected to a clock or that either the drain or source terminal of the P filed effect transistor is connected to a supply, the second code segment causes a second flag to be set, wherein when the first and second flags have been set, the second code segment determines that the node being evaluated is a predischarge node.

9. A method for detecting a predischarge node in an integrated circuit, the method comprising the steps of:

evaluating each node in the integrated circuit by analyzing the information relating to the integrated circuit to determine whether or not the node being evaluated is connected to an N field effect transistor and to a P field effect transistor, determining whether or not an N field effect transistor connected to the node being evaluated has a gate terminal which is connected to a clock and either a drain or a source terminal which is connected to ground; and determining whether or not a P field effect transistor connected to the node being evaluated has a gate terminal which is not connected to a clock and drain and source terminals which are not connected to a supply.

10. The method of claim 9, wherein if a determination is made that the N field effect transistor has a gate terminal connected to a clock and a drain or a source terminal connected to a supply, a first flag to be set.

11. The method of claim 10, wherein if a determination is made that the P field effect transistor has a gate terminal which is connected to a clock or a drain or source terminal which is connected to a supply, a second flag to be set, and wherein when the first and second flags have been set, the method determines that a predischarge node exists in the circuit.

12. The method of claim 11, wherein if a determination is made that the N field effect transistor does not have a gate terminal which is connected to a clock or does not have a drain or a source terminal which is connected to ground, then a determination is made as to whether the gate terminal is a compliment of the node being evaluated, wherein if a determination is made that the gate terminal is not the compliment of the node being evaluated, the method determines that the node being evaluated is not a predischarge node.

13. The method of claim 12, wherein the method determines whether or not the gate terminal of the P field effect transistor is the complement of the node being evaluated, wherein if the method determines that the gate node of the field effect transistor is not the complement of the node being evaluated, the method determines whether or not the gate terminal of the P field effect transistor is connected to a clock and whether or not the drain or source terminals of the P field effect transistor are connected to a supply, wherein if the method determines that the P field effect transistor is connected by its gate terminal to a clock or that either the drain or source terminal of the P field effect transistor is connected to a supply, then the method determines that the node being evaluated is not a predischarge node.

* * * * *